(12) United States Patent
Kato et al.

(10) Patent No.: US 10,020,298 B2
(45) Date of Patent: Jul. 10, 2018

(54) ESD PROTECTION DEVICE

(71) Applicant: Murata Manufacturing Co., Ltd., Nagaokakyo-shi, Kyoto-fu (JP)

(72) Inventors: Noboru Kato, Nagaokakyo (JP); Toshiyuki Nakaiso, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 15/646,571

(22) Filed: Jul. 11, 2017

(65) Prior Publication Data
US 2017/0317069 A1    Nov. 2, 2017

Related U.S. Application Data

(63) Continuation of application No. 14/839,028, filed on Aug. 28, 2015, now Pat. No. 9,741,709, which is a
(Continued)

(30) Foreign Application Priority Data

Apr. 5, 2013 (JP) .................................. 2013-079978
Jun. 17, 2013 (JP) .................................. 2013-126659

(51) Int. Cl.
*H01L 23/12* (2006.01)
*H01L 21/4763* (2006.01)
(Continued)

(52) U.S. Cl.
CPC ........ *H01L 27/0255* (2013.01); *H01L 23/528* (2013.01); *H01L 23/60* (2013.01);
(Continued)

(58) Field of Classification Search
CPC ..... H01L 27/0248; H01L 24/06; H01L 23/60; H01L 23/528; H01L 27/0207
See application file for complete search history.

(56) References Cited

U.S. PATENT DOCUMENTS

| 5,311,042 A | 5/1994 | Anceau |
| 5,416,358 A | 5/1995 | Ochi |
(Continued)

FOREIGN PATENT DOCUMENTS

| GB | 2525774 A | 11/2015 |
| JP | H04-17375 A | 1/1992 |
(Continued)

OTHER PUBLICATIONS

International Search Report issued for PCT/JP2011/067123, dated Aug. 23, 2011.
(Continued)

*Primary Examiner* — Alonzo Chambliss
(74) *Attorney, Agent, or Firm* — Arent Fox LLP

(57) ABSTRACT

The present invention is provided with a Si substrate, an ESD protection circuit formed in the Si substrate, pads formed on the surface of the Si substrate and electrically connected to first and second input/output terminals of the ESD protection circuit, a rewiring layer formed on the surface of the Si substrate for electrically connecting the pads and metal plated films, and an insulating resin film formed on the rear surface of the Si substrate. Thus, provided is an ESD protection device which can suppress the influence of external noise, etc.

17 Claims, 5 Drawing Sheets

Related U.S. Application Data continuation of application No. PCT/JP2014/054403, filed on Feb. 25, 2014.

(51) Int. Cl.
*H01L 27/02* (2006.01)
*H01L 23/528* (2006.01)
*H01L 23/00* (2006.01)
*H01L 23/60* (2006.01)
H01L 23/532 (2006.01)
H01L 23/525 (2006.01)

(52) U.S. Cl.
CPC .............. *H01L 24/06* (2013.01); *H01L 24/16* (2013.01); *H01L 27/0207* (2013.01); *H01L 27/0248* (2013.01); H01L 23/525 (2013.01); H01L 23/5329 (2013.01); H01L 2924/0002 (2013.01)

(56) References Cited

U.S. PATENT DOCUMENTS

| | | | |
|---|---|---|---|
| 6,853,089 | B2 | 2/2005 | Ujiie et al. |
| 7,285,867 | B2 | 10/2007 | Matsuzaki |
| 7,579,632 | B2 | 8/2009 | Salih et al. |
| 8,456,656 | B2 | 6/2013 | Lin |
| 8,558,383 | B2 | 10/2013 | Lin et al. |
| 8,710,645 | B2 | 4/2014 | Shau |
| 9,607,976 | B2 | 3/2017 | Nakaiso et al. |
| 9,741,709 | B2 * | 8/2017 | Kato ................... H01L 27/0255 |
| 2003/0052419 | A1 | 3/2003 | Ujiie et al. |
| 2004/0016971 | A1 | 1/2004 | Abe et al. |
| 2004/0197959 | A1 | 10/2004 | Ujiie et al. |
| 2005/0006760 | A1 | 1/2005 | Terui |
| 2007/0073807 | A1 | 3/2007 | Bobde |
| 2007/0086129 | A1 | 4/2007 | Vos et al. |
| 2007/0210317 | A1 | 9/2007 | Chou et al. |
| 2008/0121988 | A1 | 5/2008 | Mallikararjunaswamy et al. |
| 2008/0265421 | A1 | 10/2008 | Brunnbauer |
| 2009/0001607 | A1 | 1/2009 | Schmitt et al. |
| 2009/0057895 | A1 | 3/2009 | Lin et al. |
| 2009/0079001 | A1 | 3/2009 | Salih et al. |
| 2010/0155962 | A1 | 6/2010 | Inoue et al. |
| 2010/0301459 | A1 | 12/2010 | Akiba et al. |
| 2010/0314660 | A1 | 12/2010 | Salih et al. |
| 2011/0309472 | A1 | 12/2011 | Nakaiso |
| 2012/0068299 | A1 | 3/2012 | Lin |
| 2012/0326207 | A1 | 12/2012 | Yoshimochi |
| 2013/0099353 | A1 | 4/2013 | Kato et al. |
| 2013/0168837 | A1 | 7/2013 | Kato et al. |
| 2014/0332937 | A1 | 11/2014 | Brunnbuer |
| 2015/0364462 | A1 | 12/2015 | Nakaiso et al. |
| 2015/0371984 | A1 | 12/2015 | Kato et al. |
| 2017/0148707 | A1 | 5/2017 | Nakaiso et al. |

FOREIGN PATENT DOCUMENTS

| | | | |
|---|---|---|---|
| JP | H05-218459 | A | 8/1993 |
| JP | H05-268123 | A | 10/1993 |
| JP | H11-54708 | A | 2/1999 |
| JP | 2002-176106 | A | 6/2002 |
| JP | 2002-252309 | A | 9/2002 |
| JP | 2002270720 | A | 9/2002 |
| JP | 2003-092374 | A | 3/2003 |
| JP | 2003-124222 | A | 4/2003 |
| JP | 2004-119870 | A | 4/2004 |
| JP | 2004-158758 | A | 5/2004 |
| JP | 2004-281898 | A | 10/2004 |
| JP | 2005-340573 | A | 12/2005 |
| JP | 2005-032782 | A | 2/2006 |
| JP | 2006049511 | A | 2/2006 |
| JP | 2006173476 | A | 6/2006 |
| JP | 2007-123538 | A | 5/2007 |
| JP | 2008507124 | A | 3/2008 |
| JP | 2008141136 | A | 6/2008 |
| JP | 2008-277742 | A | 11/2008 |
| JP | 2009-016882 | A | 1/2009 |
| JP | 2009515323 | A | 4/2009 |
| JP | 2010-087113 | A | 4/2010 |
| JP | 2010-510662 | A | 4/2010 |
| JP | 2010-512003 | A | 4/2010 |
| JP | WO 2010/061495 | A1 | 6/2010 |
| JP | 4547247 | B2 | 9/2010 |
| JP | 2010-278040 | A | 12/2010 |
| JP | 2012-148717 | A | 8/2012 |
| JP | 2012-182381 | A | 9/2012 |
| WO | WO 2011/152255 | A1 | 12/2011 |
| WO | WO 2012/023394 | A1 | 2/2012 |
| WO | WO 2014/132938 | A1 | 9/2014 |
| WO | WO 2014162795 | A1 | 10/2014 |

OTHER PUBLICATIONS

International Search Report issued for PCT/JP2014/054404, dated May 27, 2014.
International Search Report issued for PCT/JP2014/054406, dated May 27, 2014.
International Search Report issued for PCT/JP2014/054407, dated May 27, 2014.
Written Opinion of the International Search Authority for PCT/JP2014/054403, dated May 27, 2014.
Written Opinion of the International Search Authority for PCT/JP2014/054406, dated May 27, 2014.
Written Opinion of the International Search Authority for PCT/JP2014/054404, dated May 27, 2014.
Written Opinion of the International Search Authority for PCT/JP2014/054407, dated May 27, 2014.
Decision to Grant issued for JP 2015-509950, dated Oct. 15, 2015.
International Search Report issued for PCT/JP2014/054403, dated May 27, 2014.

* cited by examiner

ESD PROTECTION DEVICE

CROSS REFERENCE TO RELATED APPLICATIONS

The present application is a continuation of U.S. patent application Ser. No. 14/839,028, filed Aug. 28, 2015, which is a continuation of PCT/JP2014/054403, filed Feb. 25, 2014, which claims priority to JP Application No. 2013-126659, filed Jun. 17, 2013, and JP Application No. 2013-079978, filed Apr. 5, 2013, the entire contents of each of which are incorporated herein by reference.

FIELD OF THE INVENTION

The present invention relates to an ESD protection device which protects an electronic circuit from surge such as electrostatic discharge.

BACKGROUND OF THE INVENTION

Various electronic devices include ICs. In order to protect the ICs from surge caused by ESD (electrostatic discharge), an ESD protection device as described in, for example, Patent Document 1 is connected to input/output parts of the ICs. Patent Document 1 discloses an ESD protection device with an integrated circuit formed on a semiconductor substrate, thereby achieving the reduction in size for ESD protection devices.

Patent Document 1: JP 2008-507124 W.

However, when a semiconductor substrate is exposed in an ESD protection device with an integrated circuit formed on the semiconductor substrate as in Patent Document 1, there is a possibility that a phenomenon will be caused in which the semiconductor substrate comes into contact with an outer conductor to cause ESD or noise current to flow through the semiconductor substrate into the integrated circuit, and further flow through a circuit (signal line) with the ESD protection device connected thereto.

SUMMARY OF THE INVENTION

Therefore, an object of the present invention is to provide an ESD protection device which can suppress the influence of external noise, etc.

The present invention characteristically includes: a semiconductor substrate with an ESD protection circuit formed; a first metallic film formed on a first surface of the semiconductor substrate, and electrically connected to a first input/output terminal of the ESD protection circuit; a second metallic film formed on the first surface of the semiconductor substrate, and electrically connected to a second input/output terminal of the ESD protection circuit; a rewiring layer formed on the first surface of the semiconductor substrate, which electrically connects the first metallic film and a first external electrode and electrically connects the second metallic film and a second external electrode; and an insulating resin film formed on a second surface of the semiconductor substrate.

In this configuration, the semiconductor substrate is protected with the insulating resin film, and thus, even when the semiconductor substrate comes into contact with an outer conductor, no noise (current) will flow in through the semiconductor substrate.

The insulating resin film is preferably a film of thermoplastic resin.

In this configuration, for example, in the case of separating individual ESD protection devices from a wafer by cutting with a dicer, the insulating resin film can flow out to side surfaces of the semiconductor substrates by heat in cutting with a dicer, and protect not only the second surface of the semiconductor substrates, but also the side surfaces.

The insulating resin film has multiple layers formed, and among the multiple layers, at least one layer closer to the semiconductor substrate is preferably a thermosetting resin.

In this configuration, even when the insulating resin film is melted by heat in cutting with a dicer to produce parts reduced in film thickness, the thermosetting resin can prevent the semiconductor substrate from being exposed.

The insulating resin film preferably has the same thickness as a resin layer included in the rewiring layer.

In this configuration, warpage can be suppressed which is caused under the influence of heat shrinkage of the semiconductor substrate, and the semiconductor substrate can be precisely cut with a dicer.

According to the present invention, the protection of the semiconductor substrate with the insulating resin film can prevent the semiconductor substrate from coming into contact with an outer conductor to cause noise (current) to flow in through the semiconductor substrate.

DETAILED DESCRIPTION OF THE EXEMPLARY EMBODIMENTS

Figure 1:
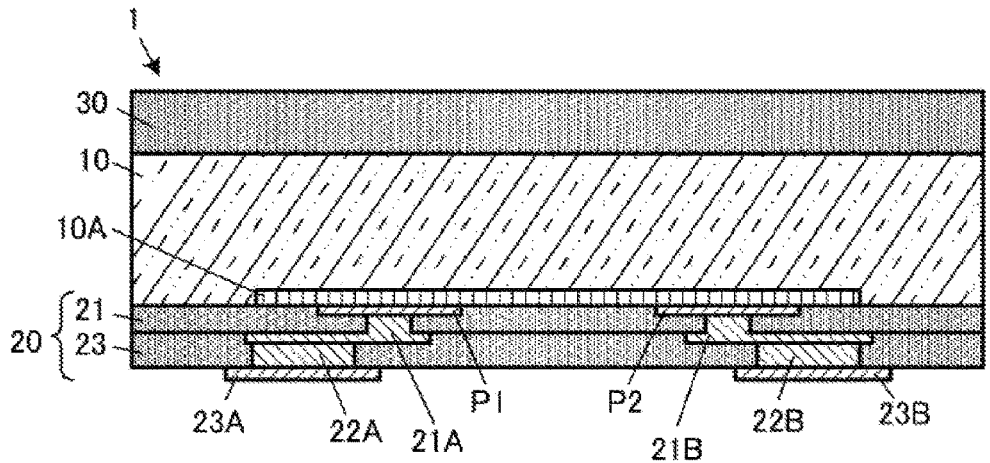
FIG. 1 is a front cross-sectional view of an ESD protection device according to an embodiment.

FIG. 1 is a front cross-sectional view of an ESD protection device according to the present embodiment. The ESD protection device 1 is a CSP (Chip Size Package) type device, where a rewiring layer 20 including multiple resin layers, etc. is formed on a Si substrate 10 configured to have an ESD protection circuit 10A including a diode and a zener diode. While the Si substrate 10 corresponds to a semiconductor substrate according to the present invention, the semiconductor substrate according to the present invention is not limited to any Si substrate, but may be a GaAs substrate or the like.

Figure 2A:
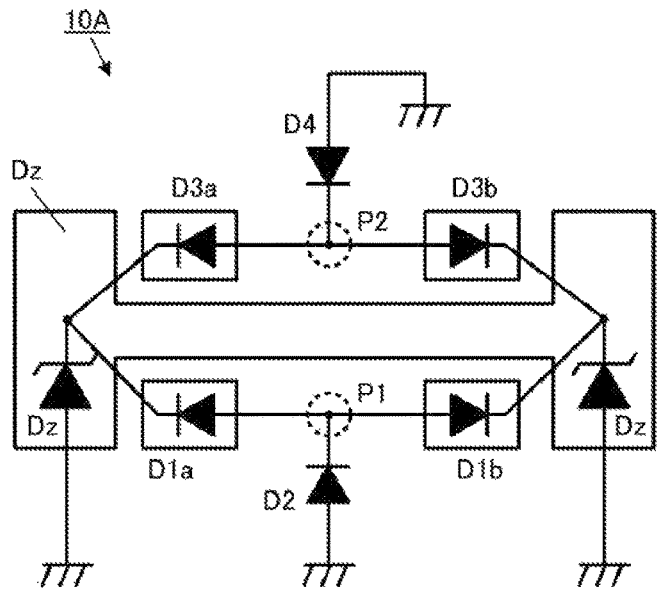
FIG. 2A is a diagram illustrating the planar configuration of an ESD protection circuit formed on a Si substrate.
Figure 2B:
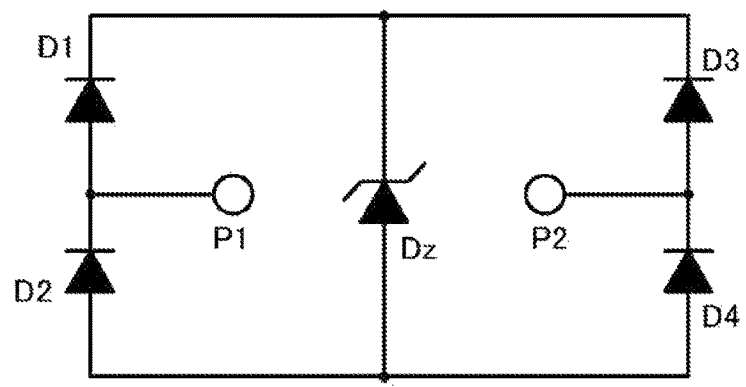
FIG. 2B is a circuit diagram of an ESD protection circuit.

FIG. 2A is a diagram illustrating the planar configuration of the ESD protection circuit 10A formed in the Si substrate 10, whereas FIG. 2B is a circuit diagram of the ESD protection circuit 10A. The Si substrate 10 is a p-type substrate, at the surface thereof, a p-type epitaxial layer is formed, n wells and p wells are sequentially formed in the p-epitaxial layer, and the wells and a p-type diffusion layer or an n-type diffusion layer form diodes and zener diodes in the Si substrate 10.

In the present embodiment, diodes D1a, D1b, D3a, D3b are formed at the surface of the Si substrate 10. Further, diodes D2, D4 and a zener diode Dz are formed in the thickness direction of the Si substrate 10. The respective elements form the circuit shown in FIG. 2B. It is to be noted that in FIG. 2B, the diodes D1a, D1b are expressed as one diode D1, whereas the diodes D3a, D3b are expressed as one diode D3.

The diodes D1, D2 formed are aligned in the forward direction and connected in series, whereas the diodes D3, D4 are aligned in the forward direction and connected in series. In addition, the diodes D1, D2 and diodes D3, D4 connected in series are each aligned in the forward direction, and connected in parallel with the zener diode Dz. Furthermore, the zener diode Dz is formed between the forming positions of the diodes D1, D4, and between the forming positions of the diodes D2, D3. The connection point between the diodes D1a, D1b and diode D2 formed serves as a first input/output terminal of the ESD protection circuit 10A, which is connected to an Al pad (hereinafter, referred to as a pad) P1 formed on the Si substrate 10. In addition, the connection point between the diodes D3a, D3b and diode D4 formed serves as a second input/output terminal of the ESD protection circuit 10A, which is connected to an Al pad (hereinafter, referred to as a pad) P2 formed on the Si substrate 10. The pads P1, P2 correspond to a first metallic film and a second metallic film according to the present invention.

The rewiring layer 20 formed on the surface layer of the Si substrate 10 includes a SiN protection film (not shown) formed on the surface of the Si substrate 10, and a resin layer 21 covering the SiN protective film, so as to partially cover the pads P1, P2. The SiN protection film is formed by sputtering, and the resin layer 21 is formed by spin coating with an epoxy (or polyimide) solder resist. The SiN protection film and the resin layer 21 have openings (contact holes) formed for exposing parts of the pads P1, P2.

Layers of Ti and Cu are formed in the contact holes and on regions around the contact holes, and the layers constitute interlayer wirings 21A, 21B. Columnar in-layer electrodes 22A, 22B are formed partially on the surfaces of the interlayer wirings 21A, 21B. The in-layer electrodes 22A, 22B are built in a resin layer 23 composed of an epoxy (or polyimide) resin.

The surfaces of the in-layer electrodes 22A, 22B have metal plated films 23A, 23B such as Ni/Au or Ni/Sn formed. The metal plated films 23A, 23B are electrically connected to the in-layer electrodes 22A, 22B. The ESD protection device 1 is mounted on a mother board so that the metal plated films 23A, 23B serve as a surface connected to the mother board such as a printed wiring board. In addition, in the present embodiment, the metal plated film 23A is connected to a terminal electrode for signal line of the mother board, whereas the metal plated film 23B is connected to a terminal electrode for grounding.

On the rear surface (the surface on the side opposite to the surface with the rewiring layer 20 formed) of the Si substrate 10, an insulating resin film 30 is formed by applying a solder resist such as an epoxy resin with a resistivity of 1 MΩ·cm, for example. The formation of the insulating resin film 30 can prevent external current from affecting the ESD protection device 1. The principle for operation of the ESD protection device 1 will be described below as well with reference to FIGS. 2 and 3.

Figure 3A:
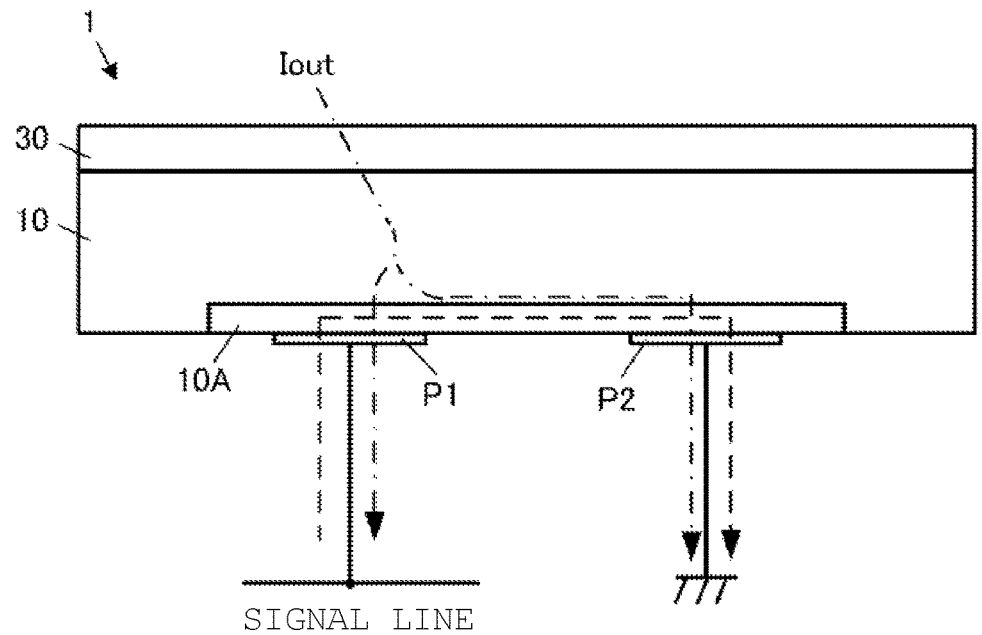
FIG. 3A is a diagram illustrating the pathway of current flowing through an ESD protection device.
Figure 3B:
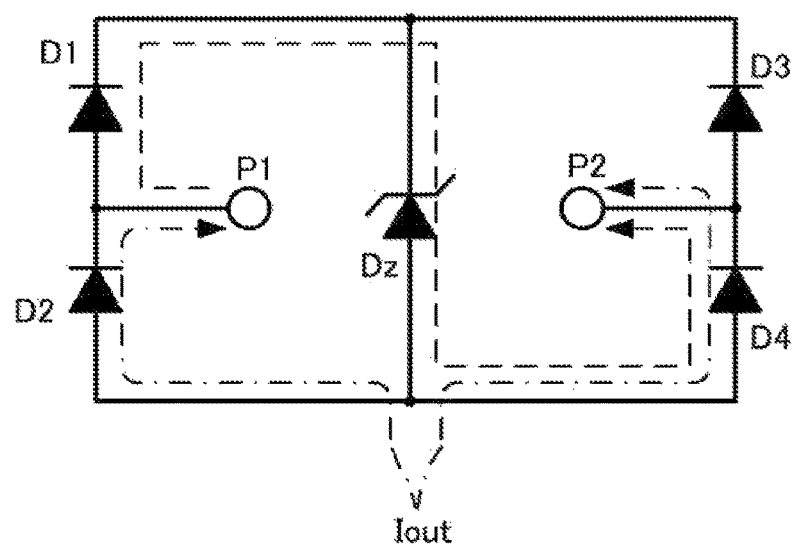
FIG. 3B is a diagram illustrating the pathway of current flowing through an ESD protection device.

FIGS. 3A and 3B are diagrams illustrating the pathway of current flowing through the ESD protection device 1. It is to be noted that the illustration of the rewiring layer 20 is omitted in FIG. 3A.

As described above, the pad P1 leading to the first input/output terminal of the ESD protection circuit 10A is connected to a signal line, whereas the pad P2 leading to the second input/output terminal is connected to the ground. The surge current from the signal line to the pad P1 flows from the diode D1 and the zener diode Dz through the diode D4 to the pad P2, as shown by the pathway of a dashed line in FIGS. 3A and 3B. Then, the current is discharged from the pad P2 to the ground for a mother board with the ESD protection device 1 connected thereto.

As described above, the respective elements of the ESD protection circuit 10A are formed in the Si substrate 10 as a p-type substrate. For this reason, if an outer conductor comes into contact with the Si substrate 10 of the ESD protection device 1 without the insulating resin film 30 formed, there is a possibility that a current Iout will flow into the Si substrate 10 from the outer conductor. In this case, there is a possibility that the current Iout will flow from the diodes D2, D4 into the pads P1, P2 as shown in FIG. 3B, and flow from there into the signal line. In this case, the function of the ESD protection device 1 will be damaged, such as discharge of surge current from the signal line to the ground. According to the present invention, the formation of the insulating resin film 30 on the Si substrate 10 can prevent the current Iout from flowing into the Si substrate 10.

It is to be noted that the ESD protection device 1 is bidirectional, and for example, when surge current is input from the pad P2, the current is discharged from the pad P1 to the ground through the diode D3, the zener diode Dz, and the diode D2.

In addition, the insulating resin film 30 has the same thickness as the rewiring layer 20. The ESD protection device 1 is formed (chipping) by cutting integrated circuits formed on a silicon wafer with a dicer. If the insulating resin film 30 is not formed, there is a possibility that the silicon wafer will be pulled to the rewiring layer 20 to cause warpage when the insulating resin film 30 is subjected to curing, thereby resulting in failure to cut the silicon wafer in a horizontal position with a dicer. Therefore, the formation of, on the rear surface of the Si substrate 10, the insulating resin film 30 which has almost the same thickness and the same material as the rewiring layer 20 can suppress warpage of the silicon wafer, and cut the silicon wafer in a horizontal position with a dicer. In addition, the insulating resin film 30 can prevent the Si substrate 10 from being subjected to chipping. It is to be noted that the thickness of the insulating resin film 30 is not limited to the same thickness as the rewiring layer 20.

Figure 4:
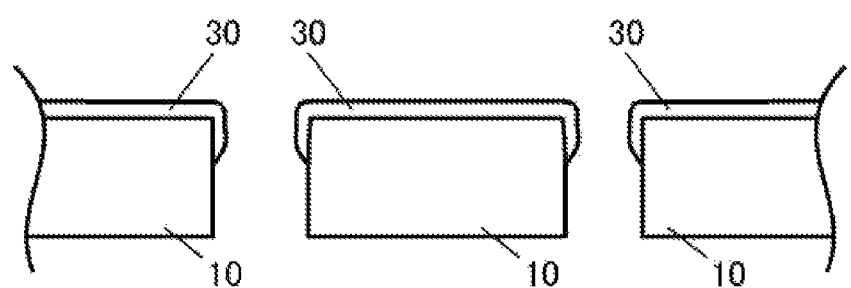
FIG. 4 is a schematic diagram illustrating cut sections of an ESD protection device, which are obtained when an insulating resin film is thermoplastic.

This insulating resin film 30 may be thermoplastic, and in this case, the influence of the current Iout may be further suppressed. FIG. 4 is a schematic diagram illustrating cut sections of the ESD protection device 1, which are obtained when the insulating resin film 30 is thermoplastic. When the ESD protection device 1 is formed (chipping) by cutting the integrated circuits formed on the silicon wafer with a dicer, the insulating resin films 30 hang over side surfaces of the Si substrates 10 by heat generation in the case of the cutting with a dicer, as shown in FIG. 4. Thus, the insulating resin film 30 can insulate and protect not only the rear surfaces of the Si substrates 10, but also the side surfaces.

Figure 5:
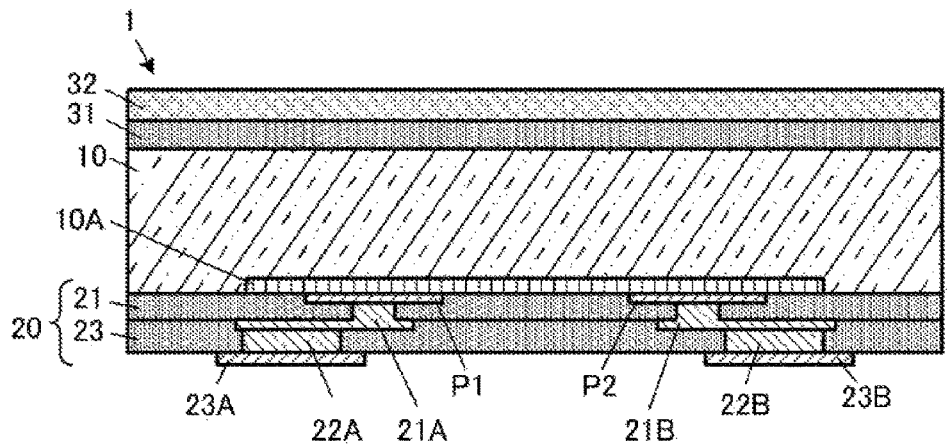
FIG. 5 is a cross-sectional view of an ESD protection device obtained when multiple layers of insulating resin films are formed.

In addition, multiple layers of insulating resin films may be formed on the rear surface of the Si substrate 10. FIG. 5 is a cross-sectional view of an ESD protection device obtained when multiple layers of insulating resin films are formed. In this example, a thermosetting resin 31 is formed on the rear surface of the Si substrate 10, and further, a thermoplastic resin 32 is formed. In this case, even when the thermoplastic resin 32 is melted by heat in cutting with a dicer to produce parts reduced in film thickness, the thermosetting resin 31 can prevent the Si substrate 10 from being exposed.

It is to be noted that three or more layers of insulating resin films may be formed. In this case, at least one layer closer to the Si substrate 10 is preferably a thermosetting resin, in order to prevent the Si substrate 10 from being exposed.

Figure 6:
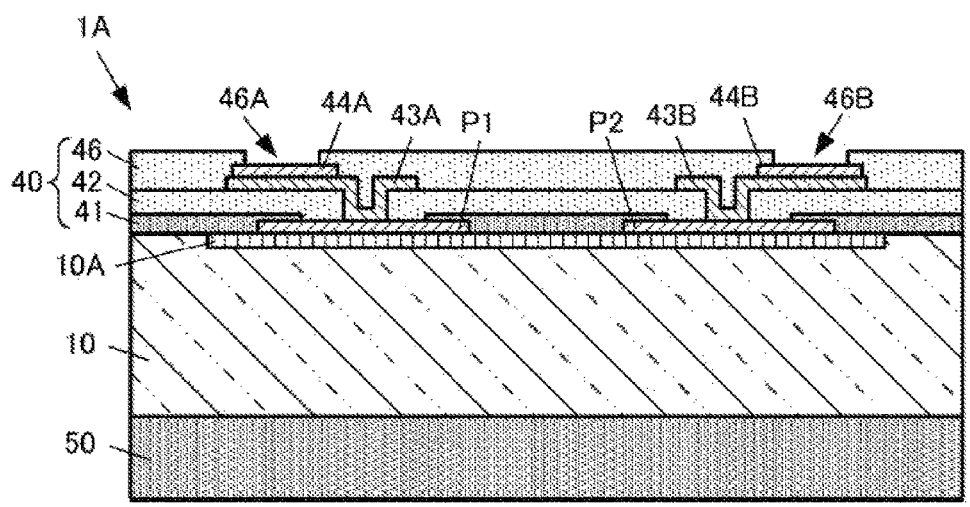
FIG. 6 is a front cross-sectional view of another example of an ESD protection device according to an embodiment.

FIG. 6 is a front cross-sectional view of another example of the ESD protection device 1 according to the present embodiment. The ESD protection device 1A has, as in FIG. 1, the Si substrate 10 with the ESD protection circuit 10A configured, and a rewiring layer 40 formed on the Si substrate 10.

The rewiring layer 40 formed on the surface layer of the Si substrate 10 includes a SiN (or $SiO_2$) protection film 41 formed on the surface of the Si substrate 10 so as to partially cover peripheral edges of the pads P1, P2, and a resin layer 42 covering the SiN protective film 41 and the pads P1, P2. The SiN protection film 41 is formed by sputtering, and the resin layer 42 is formed by spin coating with an epoxy (or polyimide) solder resist. The resin layer 42 has contact holes formed for exposing parts of the pads P1, P2.

Ti/Cu/Ti electrodes 43A, 43B are formed in the contact holes and on regions around the holes. The Ti/Cu/Ti electrodes 43A, 43B have planar parts opposed to the surface of the Si substrate 10, and have electrical connection to the pads P1, P2 through the contact holes of the resin layer 42. The Ti/Cu/Ti electrodes 43A, 43B serve as current pathways for surge current (ESD current) through the ESD protection device 1A.

External electrodes 44A, 44B of Au/Ni are formed partially on the planar parts of the Ti/Cu/Ti electrodes 43A, 43B. The parts of the Ti/Cu/Ti electrodes 43A, 43B, on which the external electrodes 44A, 44B are formed, are etched to have Cu exposed, and the exposed Cu parts are selectively plated with the external electrodes 44A, 44B. The external electrodes 44A, 44B serve as terminal electrodes for input/output terminals of the ESD protection device 1, and correspond to, for example, the metal plated films 23A, 23B shown in FIG. 1.

The rewiring layer 40 includes a resin layer 46 further formed on the resin layer 42. The resin layer 46 is, for example, a layer of low-dielectric-constant epoxy resin (or a polyimide resin, a liquid crystal polymer, or the like). It is to be noted that the Ti/Cu/Ti electrodes 43A, 43B have Ti as a surface layer, and thus have a joint strength between the Ti/Cu/Ti electrodes 43A, 43B and the resin layer 46. This resin layer 46 has openings 46A, 46B formed for exposing parts of the external electrodes 44A, 44B.

On the rear surface of the Si substrate 10, an insulating resin film 50 is formed by applying a solder resist such as an epoxy resin with a resistivity of 1 MΩ·cm, for example. The insulating resin film 50 has the same thickness as the rewiring layer 40.

The formation of the insulating resin film 50 can prevent external current from affecting the ESD protection device 1A. In addition, the formation of the insulating resin film 50 can suppress warpage of the silicon wafer during manufacture.

Figure 7A:
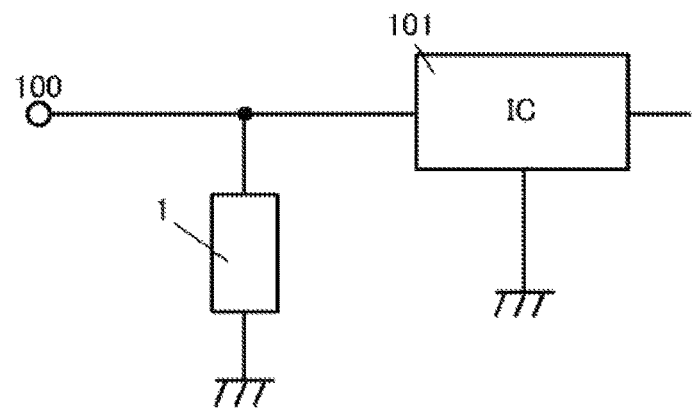
FIG. 7A is a diagram illustrating an example of connecting an ESD protection device according to an embodiment.
Figure 7B:
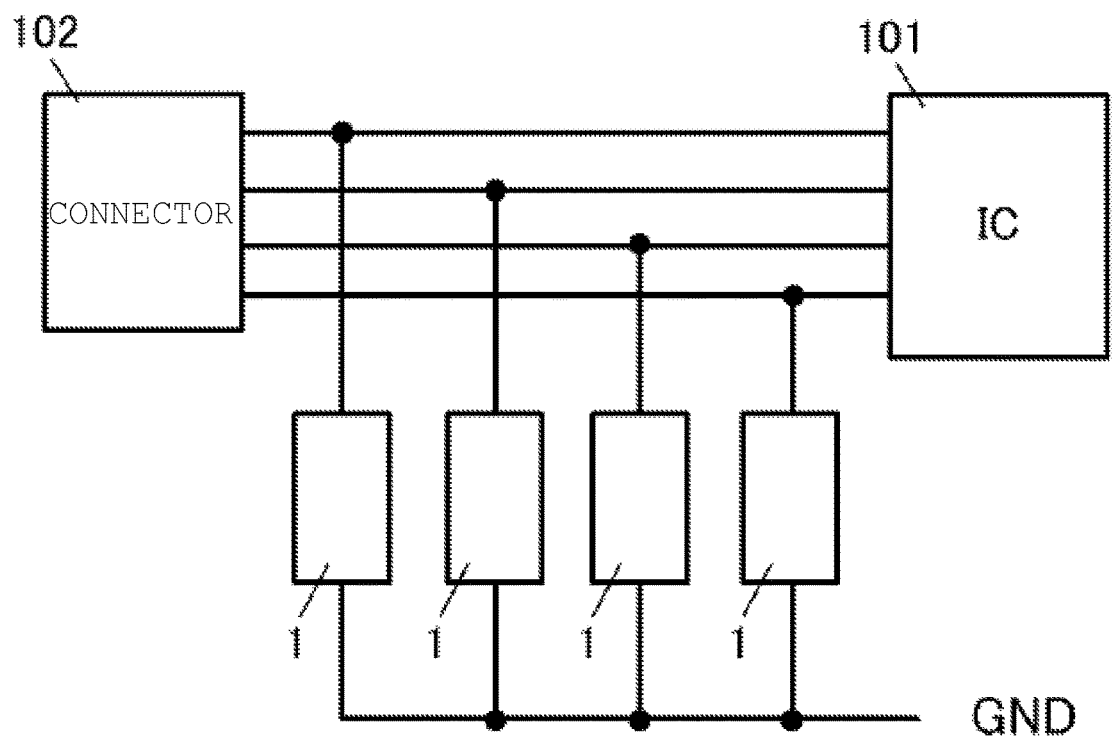
FIG. 7B is a diagram illustrating an example of connecting an ESD protection device according to an embodiment.

FIGS. 7A and 7B are diagrams illustrating examples of connecting the ESD protection device 1 according to the present embodiment. The ESD protection device 1 is mounted on an electronic device. Examples of the electronic device include laptop PCs, tablet terminals, cellular phones, digital cameras, and portable music players.

FIG. 7A shows an example of connecting the ESD protection device 1 between a single line connecting an I/O port 100 and an IC 101 to be protected, and GND. The I/O port 100 is, for example, a port to which an antenna is connected. The ESD protection device 1 according to the present embodiment is bidirectional, and any of the first input/output terminal and second input/output terminal may serve as an input terminal. For example, when the first input/output terminal is treated as an input terminal, the first input/output terminal is connected to the signal line, whereas the second input/output terminal is connected to the GND.

FIG. 7B shows an example of connecting the ESD protection devices 1 between single lines connecting a connector 102 and an IC 101, and a GND line. The signal lines in this example are, for example, high-speed transmission lines (differential transmission lines), and the ESD protection device 1 is connected between each of the multiple signal lines and the GND line.

As described above, for the ESD protection device 1 according to the present embodiment, the formation of the insulating resin film 30 on the Si substrate 10 can prevent the Si substrate 10 from coming into contact with an outer conductor to cause noise (current) to flow through the Si substrate 10 into the signal line.

DESCRIPTION OF REFERENCE SYMBOLS 1, 1A ESD protection device
10 Si substrate
10A ESD protection circuit
20 rewiring layer
21 resin layer
21A, 21B interlayer wiring
22A, 22B in-layer electrode
23 resin layer
23A metal plated film (first external electrode)
23B metal plated film (second external electrode)
30 insulating resin film
31 thermosetting resin
32 thermoplastic resin
40 rewiring layer
41 SiN protection film
42 resin layer
43A, 43B Ti/Cu/Ti electrode
44A, 44B external electrode
46 resin layer
46A, 46B opening
50 insulating resin film
P1 pad (first metallic film)
P2 pad (second metallic film)
D1 to D4 diode
Dz zener diode

The invention claimed is:
1. An electrostatic discharge (ESD) protection device comprising:
a semiconductor substrate with an ESD protection circuit formed thereon;

a first metallic film formed on a first surface of the semiconductor substrate, and electrically connected to a first input/output terminal of the ESD protection circuit;

a second metallic film formed on the first surface of the semiconductor substrate, and electrically connected to a second input/output terminal of the ESD protection circuit;

a rewiring layer formed on the first surface of the semiconductor substrate, the rewiring layer electrically connecting the first metallic film and a first external electrode and electrically connecting the second metallic film and a second external electrode; and an insulating resin film directly on the semiconductor substrate, the insulating resin film completely covering a second surface of the semiconductor substrate, wherein the ESD protection circuit includes a plurality of diodes formed in a thickness direction of the semiconductor substrate, wherein the thickness direction extends between the rewiring layer formed on the first surface of the semiconductor substrate and the insulating resin film covering the second surface of the semiconductor substrate.

2. The ESD protection device according to claim 1, wherein the insulating resin film is a layer of thermoplastic resin.

3. The ESD protection device according to claim 1, wherein the insulating resin film has multiple layers, and among the multiple layers with at least one layer closer to the semiconductor substrate is a thermosetting resin.

4. The ESD protection device according to claim 1, further comprising a resin layer between the first and second metallic films and the first and second external electrodes.

5. The ESD protection device according to claim 4, wherein the insulating resin film has the same thickness as a thickness of the resin layer.

6. The ESD protection device according to claim 5, wherein the insulating resin film is a layer of thermoplastic resin.

7. The ESD protection device according to claim 5, wherein the insulating resin film has multiple layers, and among the multiple layers with at least one layer closer to the semiconductor substrate is a thermosetting resin.

8. The ESD protection device according to claim 5, further comprising a resin layer between the first and second metallic films and the first and second external electrodes.

9. The ESD protection device according to claim 1, wherein the rewiring layer includes a plurality of in-layer electrodes.

10. The ESD protection device according to claim 1, wherein the insulating resin film is thinner in the thickness direction than the semiconductor substrate.

11. An electrostatic discharge (ESD) protection device comprising:

a semiconductor substrate with an ESD protection circuit formed thereon;

a first metallic film formed on a first surface of the semiconductor substrate, and electrically connected to a first input/output terminal of the ESD protection circuit;

a second metallic film formed on the first surface of the semiconductor substrate, and electrically connected to a second input/output terminal of the ESD protection circuit;

a rewiring layer formed on the first surface of the semiconductor substrate, the rewiring layer electrically connecting the first metallic film and a first external electrode and electrically connecting the second metallic film and a second external electrode; and an insulating resin film directly on the semiconductor substrate, the insulating resin film completely covering a second surface of the semiconductor substrate, wherein the ESD protection circuit includes a plurality of diodes formed in a thickness direction of the semiconductor substrate, and wherein the first and second metallic films overlap the ESD protection circuit formed on the semiconductor substrate in a plan view of the semiconductor substrate.

12. The ESD protection device according to claim 11, wherein the insulating resin film is a layer of thermoplastic resin.

13. The ESD protection device according to claim 11, wherein the insulating resin film has multiple layers, and among the multiple layers with at least one layer closer to the semiconductor substrate is a thermosetting resin.

14. The ESD protection device according to claim 11, further comprising a resin layer between the first and second metallic films and the first and second external electrodes.

15. The ESD protection device according to claim 11, wherein a thickness of the insulating resin film is the same as a thickness of the resin layer.

16. The ESD protection device according to claim 11, wherein the rewiring layer includes a plurality of in-layer electrodes.

17. The ESD protection device according to claim 11, wherein the insulating resin film is thinner in a thickness direction than the semiconductor substrate, the thickness direction extending between the rewiring layer formed on the first surface of the semiconductor substrate and the insulating resin film covering the second surface of the semiconductor substrate.

* * * * *